US006919744B2

(12) United States Patent
Paist et al.

(10) Patent No.: US 6,919,744 B2
(45) Date of Patent: Jul. 19, 2005

(54) SPECTRUM PROFILE CONTROL FOR A PLL AND THE LIKE

(75) Inventors: Kenneth W. Paist, Spring City, PA (US); Parag D. Parikh, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/644,362

(22) Filed: Aug. 20, 2003

(65) Prior Publication Data

US 2005/0040893 A1 Feb. 24, 2005

(51) Int. Cl.[7] .............................................. H03K 21/00
(52) U.S. Cl. ....................... 327/115; 327/117; 327/156; 375/376
(58) Field of Search ......................... 327/113–119, 141, 327/162, 146–148, 163, 154–157; 331/DIG. 2; 375/373–376; 455/260

(56) References Cited

U.S. PATENT DOCUMENTS

| 5,021,754 | A | * | 6/1991 | Shepherd et al. ........... 332/128 |
| 5,337,024 | A | * | 8/1994 | Collins ........................ 332/127 |
| 5,872,487 | A | * | 2/1999 | Adachi et al. ............... 331/1 A |
| 5,872,807 | A | * | 2/1999 | Booth et al. ................. 375/130 |
| 6,292,507 | B1 | * | 9/2001 | Hardin et al. ............... 375/130 |
| 6,308,049 | B1 | * | 10/2001 | Bellaouar et al. ............. 455/76 |
| 6,377,646 | B1 | * | 4/2002 | Sha ............................. 375/376 |
| 6,553,057 | B1 | * | 4/2003 | Sha et al. .................... 375/130 |
| 6,559,698 | B1 | * | 5/2003 | Miyabe ....................... 327/157 |
| 6,628,276 | B1 | * | 9/2003 | Elliott ........................ 345/213 |
| 6,700,945 | B2 | * | 3/2004 | Maeda ........................ 375/376 |
| 6,724,265 | B2 | * | 4/2004 | Humphreys .................. 331/17 |
| 6,728,526 | B2 | * | 4/2004 | Yamada et al. ............. 455/260 |

* cited by examiner

Primary Examiner—Timothy P. Callahan
Assistant Examiner—Hai L. Nguyen

(57) ABSTRACT

Frequency spectrum spreading of a timing recovery circuit, such as a PLL, is controlled by periodically calculating each value for a divisor, M, of a fractional divider in the feedback path of the PLL. The fractional divider divides the output signal of a voltage-controlled oscillator (VCO) of the PLL by the divisor, M, and the value for divisor, M, is periodically updated based on a spreading profile. The output of the fractional divider and a reference clock signal are provided to a phase detector of the PLL so as to cause the PLL to slew the output frequency of the PLL in accordance with the spreading profile.

20 Claims, 4 Drawing Sheets

US 6,919,744 B2

SPECTRUM PROFILE CONTROL FOR A PLL AND THE LIKE

BACKGROUND OF THE INVENTION

1. Field of the Invention

The present invention relates to phase-locked loop (PLL) circuits, and, more particularly, to controlling a profile of the PLL circuit's output frequency spectrum.

2. Description of the Related Art

In many electronics applications, digital circuits are employed that operate with one or more clock signals. Personal computers commonly employ a processor that may operate based on a clock having a frequency of 350 MHz or more. However, at such high frequencies, these digital circuits may radiate signals as electromagnetic energy, and these electromagnetic emissions may interfere with the operation of surrounding equipment. Since these emissions are based upon clock signals, high emitted energy "spikes" occur at these clock signal frequencies and their harmonics. Consequently, equipment is often shielded to prevent or minimize these emissions within certain frequency ranges, or operation is modified to spread the emitted energy over a wider frequency range, thereby decreasing the energy at any given frequency. One technique for modifying the operation of a digital circuit is to vary the clock frequency over a range of frequencies such that the average frequency is the desired clock frequency, but the emitted energy is now "spread" over the range of frequencies. Such variation of the clock is termed "spread spectrum" and reduces the interference from high energy spikes at the clock frequency.

A synthesizer generating one or more clock signals often employs a phase-locked loop (PLL). A PLL is a circuit that generates a periodic output signal that has a constant phase and frequency with respect to a periodic input signal. PLLs are widely used in many types of measurement, microprocessor, and communication applications. One type of phase-locked loop is the charge-pump PLL, which is described in Floyd M. Gardner, "Charge-Pump Phase-Lock Loops" *IEEE Trans. Commun.*, vol. COM-28, pp. 1849–1858, November 1980, the teachings of which are incorporated herein by reference. In many applications, the frequency of the output signal is higher than the frequency of the input signal.

In a conventional charge-pump phase-locked loop, a phase detector (PD) compares the phase $\theta_{IN}$ of the input reference clock signal to the phase $\theta_{OUT}$ of a feedback signal derived from the PLL output. Based on the comparison, the PD generates an error signal: either an UP signal (when $\theta_{IN}$ leads $\theta_{OUT}$) or a DOWN signal (when $\theta_{OUT}$ leads $\theta_{IN}$), where the error signal indicates the difference between $\theta_{IN}$ and $\theta_{OUT}$. A charge pump generates an amount of charge equivalent to the error signal from the PD, where the sign of that charge indicates the direction of UP or DOWN. Depending on whether the error signal was an UP signal or a DOWN signal, the charge is either added to or subtracted from the capacitance in a loop filter. As such, the loop filter operates as an integrator that accumulates the net charge from the charge pump. The resulting loop-filter voltage $V_{LF}$ is applied to a voltage-controlled oscillator (VCO). A voltage-controlled oscillator is a device that generates a periodic output signal, whose frequency is a function of the VCO input voltage. Input and feedback dividers may be placed in the input and feedback paths, respectively, if the frequency of the output signal is to be either a fraction or a multiple of the frequency of the input signal.

One method of spread spectrum to vary a clock frequency employs modification of the feedback divider used to control the output clock frequency of the PLL. The feedback divider typically divides the output signal of the VCO by a fixed number N to generate a signal close, in frequency, to the input reference clock signal. By varying the value of N, the divided output of the VCO applied to the phase detector also varies the output frequency of the VCO. Spread spectrum techniques of the prior art typically vary the frequency in discrete steps by reading successive values for N from a table stored in memory and supplying the successive values of N to the feedback divider.

SUMMARY OF THE INVENTION

The present invention relates to a phase-locked loop (PLL) circuit that employs spectrum spreading of the PLL output signal frequency. Frequency spectrum spreading of the PLL is controlled by periodically calculating each value for a divisor, M, of a fractional divider in the feedback path of the PLL. The fractional divider divides the output signal of a voltage-controlled oscillator (VCO) of the PLL by the divisor, M, and the value for the divisor, M, is periodically updated based on a spreading profile. The output of the fractional divider and a reference clock signal are provided to a phase detector of the PLL so as to cause the PLL to slew the output frequency of the PLL in accordance with the spreading profile.

In accordance with exemplary embodiments of the present invention, a signal generator circuit calculates, in real time, a divisor value in accordance with a spreading profile characterized by a function. A fractional divider divides an output signal of the signal generator circuit by the divisor value. The signal generator adjusts, based on the divided output signal and a reference signal, a frequency of the output signal of the signal generator circuit; and one or more new divisor values are subsequently calculated in accordance with the spreading profile so as to slew the frequency of the output signal of the signal generator without discontinuities in the slewed frequency.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
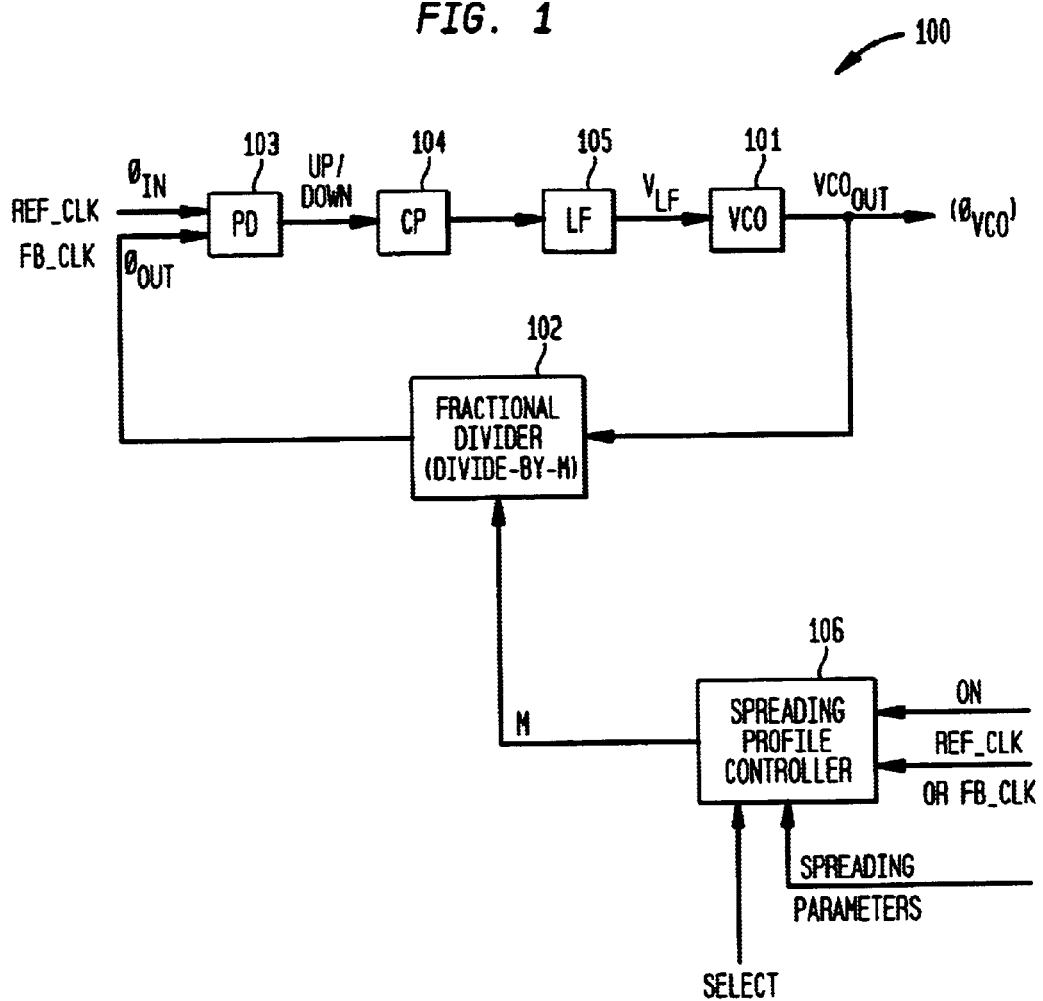
FIG. 1 shows a block diagram of a phase-locked loop (PLL) employing spread spectrum profile control in accordance with an exemplary embodiment of the present invention.

FIG. 1 shows a block diagram of phase-locked loop (PLL) 100 having spread spectrum control and operating in accordance with an exemplary embodiment of the present invention. PLL 100 comprises voltage-controlled oscillator (VCO) 101, fractional divider 102, phase detector (PD) 103, charge pump (CP) 104, loop filter (LF) 105, and spreading profile controller 106. PLL 100 tends to synchronize the frequency $f_{vco}$ of the output signal $VCO_{OUT}$ provided by VCO 101 to a frequency that is a multiple of the frequency $f_{REF}$ of the reference clock REF_CLK.

Loop-filter voltage $V_{LF}$ is a control voltage applied to VCO 101 to set the frequency of the output signal provided by VCO 101. VCO 101 might be implemented as an inductor-capacitor (LC) oscillator having a fixed inductor value and a variable capacitor value. Other types of VCOs well-known in the art, such as crystal or ring oscillator VCOs, might be employed for VCO 101. The output signal $VCO_{OUT}$ of VCO 101 is provided as the output signal of PLL 100.

The output signal $VCO_{OUT}$ of VCO 101 is also provided to fractional divider 102, which divides the output signal of VCO 101 by a divisor, M, to generate a feedback clock signal FB_CLK having phase $\theta_{OUT}$. M may be i) an integer or iii) an integer plus a non-integer fraction. Consequently, the frequency $f_{VCO}$ of the signal provided by VCO 101 is related to the frequency $f_{REF}$ of the reference clock REF_CLK by $f_{VCO}=f_{REF}*M$.

In accordance with exemplary embodiments of the present invention, spreading profile controller 106 generates a desired value $M_{DES}$ for the divisor, M, according to a spreading profile, such as a triangular profile, as described subsequently. Spreading profile controller 106 receives one or more spreading parameters, an "ON" signal indicating spreading is enabled, a select signal to select one of a plurality of spreading profiles, and either the reference clock signal REF_CLK or feedback clock signal FB_CLK. For preferred embodiments of the present invention, spreading profile controller 106 receives the feedback clock signal FB_CLK to allow for proper timing between generation of the divisor, M, and the fractional division of the VCO output signal $VCO_{OUT}$. Spreading profile controller 106 generates a sequence of desired values for $M_{DES}$ in real time in accordance with a specified input function that defines the spreading profile by one or more spreading parameters, such as modulation rate, modulation depth, and contour coefficients. For example, if varying the frequency up and down linearly, the slope and direction (up/down in frequency or about a mean) might be provided as spreading parameters. The spreading profile defines slewing of the VCO's output signal frequency across a predefined range of frequencies. Spreading profile controller 106 might be implemented with a microprocessor, state machine, or other form of processor.

PD 103 compares the phase $\theta_{IN}$ of the input reference clock signal REF_CLK to the phase $\theta_{OUT}$ of feedback clock signal FB_CLK from fractional divider 102. Based on the comparison, PD 103 generates an either an UP signal (when $\theta_{IN}$ leads $\theta_{OUT}$) or a DOWN signal (when $\theta_{OUT}$ leads $\theta_{IN}$), where the error signal indicates the magnitude of the difference between $\theta_{IN}$ and $\theta_{OUT}$. CP 104 generates an amount of charge equivalent to the error signal from PD 103, where the sign of that charge corresponds to the direction of UP or DOWN. Depending on whether the error signal was an UP signal or a DOWN signal, the charge is either added to or subtracted from the capacitance of loop filter 105. The loop filter may have a relatively simple design, comprising a capacitor in parallel with the series combination of a resistor R and a relatively large capacitor. Loop filter 105 accumulates the net charge from CP 104 to generate the loop-filter voltage $V_{LF}$ that sets the frequency of the output signal of VCO 101.

Figure 2:
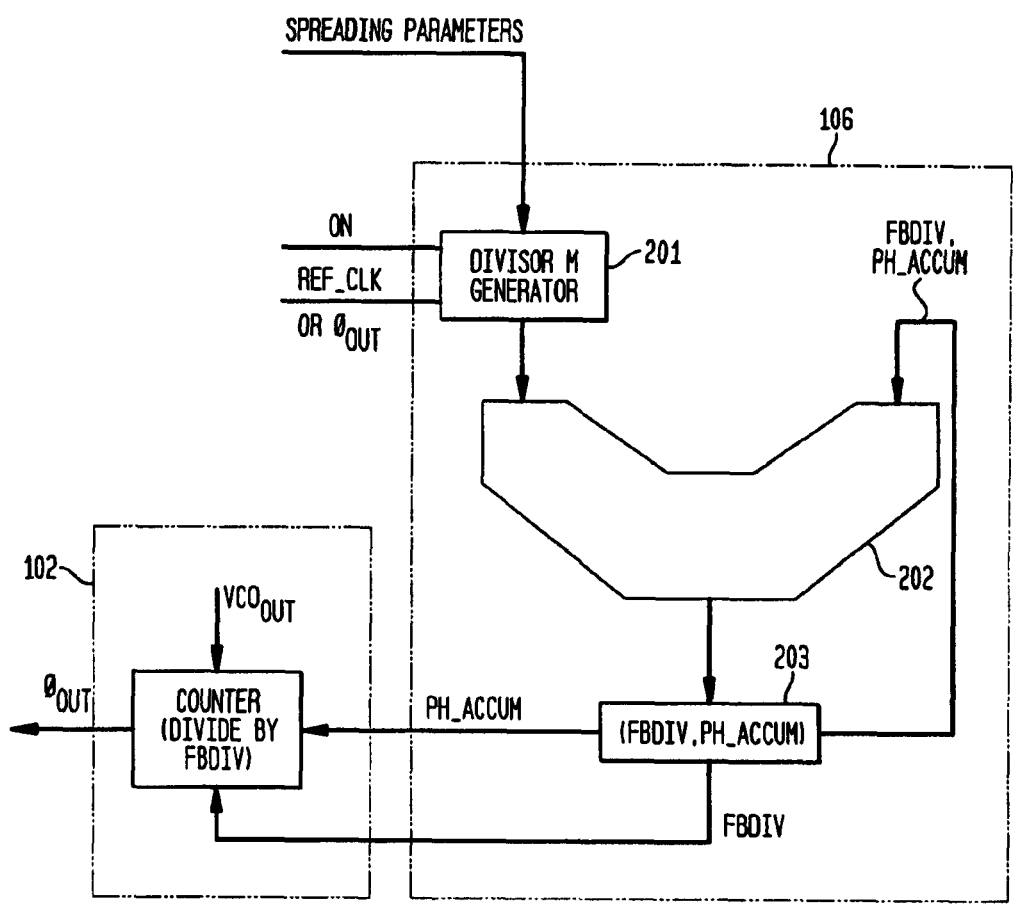
FIG. 2 shows an exemplary embodiment of the fractional divider employed by the PLL of FIG. 1.

FIG. 2 shows an exemplary embodiment of spreading profile controller 106 and fractional divider 102. As shown in FIG. 2, divisor M generator 201 of spreading profile controller 106 receives a signal "ON" to enable spreading, one or more spreading parameters including the nominal value for M, $M_{NOM}$, and the FB_CLK signal for timing generation of values for the divisor, M, that is synchronized to the feedback clock signal. Synchronizing the generation of values for the divisor, M, to the feedback clock signal allows for updating the phase accumulation for the fractional accumulation technique, described subsequently. Divisor M generator 201 might instead receive the reference clock signal REF_CLK for timing generation of values for the divisor, M, if other means are employed to update the phase accumulation. Divisor M generator 201 generates a desired value $M_{DES}$ for the divisor, M, according to a spreading profile, which desired value $M_{DES}$. The difference between the current and desired value for M is then applied to combiner 202 of spreading profile controller 106. The desired value $M_{DES}$ is represented as an integer and a fraction with a given precision.

Since the desired value $M_{DES}$ might not be an integer, the divider in the feedback path is a fractional divider. Various types of fractional dividers are known in the art and may be employed for the present invention. In the exemplary embodiment of FIG. 2, a fractional accumulation technique is employed for fractional division of the VCO's output signal. In the fractional accumulation technique, an integer counter is employed to divide the input signal by two integers N and D. In the counter, multiple phases of the divided VCO output signal might be available. For example, since a counter is implemented as a series of coupled registers, the values of each register correspond to a particular phase of the counter sequence. If a counter has N is 4, then each register of the counter provides a 90 degree phase-shifted version of the counter's output sequence. In general, if the counter divides by N, there are N replicas of the divided signal shifted in phase with respect to one another by $2\pi/N$.

To obtain a fractional divider, the frequency of the digital signal is divided by two different non-zero integers N and D. The divisions by N and D are alternately performed, as appropriate; an average division between these two values is thus obtained. The resulting signal thus actually corresponds to the input digital signal, the frequency of which is divided by a fractional number comprised between N and D. The resulting signal exhibits a phase error which is all the greater as values N and D are distant from each other. The phase error (also termed jitter) of the resulting signal is proportional to the period of the input signal multiplied by the difference between values N and D. Since N and D are integers, the minimum jitter corresponds to the minimum interval between these two values, which is 1, yielding alternating division between N and (N+1).

Another factor is the resolution of the fractional component of the divisor, which is related to the number K of clock cycles over which the fractional divider generates the average fractionally divided signal. The resolution, K, is also the phase error per clock cycle division. By accumulating the phase error (phase accumulation), the point where the phase accumulation exceeds 360 degrees is where the division by N is reset to division by (N+1). For example, if the VCO output signal is to be divided by 2.5, each clock cycle a division of the signal by two is performed and the phase accumulation is advanced by 180 degrees. The phase accumulation is updated by adding 180 degrees for each clock cycle. Once the phase accumulation passes 0 degrees (i.e., goes through 360 degrees), the signal is then divided by 3.

Returning to FIG. 2, to divide by a value $M_{DES}$ that is represented by an integer and a fraction, the integer value FBDIV of $M_{DES}$ is employed as the value for N of the counter, and the value of the fraction is converted to a phase value PH_ACCUM. Dividing the input signal by the integer FBDIV instead of the whole value $M_{DES}$ creates a phase error between the actual and desired divided input signal. The phase error might then be corrected for by advancing or delaying the phase of the output signal. Consequently, the phase error is tracked and accumulated as PH_ACCUM for each clock cycle. The phase value PH_ACCUM is employed to address a specific phase of the counter to provide a shifted phase of the divided input signal that corresponds to the fractional division of the input signal at the current clock instant. Since the integer and/or fractional part of $M_{DES}$ increases or decreases as $M_{DES}$ is updated on each clock cycle, the values of FBDIV and PH_ACCUM are updated to account for the phase error from the update of $M_{DES}$ in addition to the tracked phase error for the fractional division. Once the value of PH_ACCUM crosses the 0 value, the counter value is increased by 1 to divide by FBDIV+1.

Spreading profile controller 106 includes an accumulator comprising combiner 202 (which may be implemented as an adder) and register 203. Fractional divider 102 comprises counter 204. Counter 204 is an integer counter that counts to FBDIV, and the phase of the output of counter 204 may be selected via PH_ACCUM to implement the fractional accumulation technique described above. The current value of $M_{DES}$ and the previous integer and phase values, FBDIV and PH_ACCUM, corresponding to the previous value of $M_{DES}$ from register 203, are combined by combiner 202 to generate updated values for FBDIV and PH_ACCUM. The updated values for FBDIV and PH_ACCUM from combiner 202 are provided to register 203. The updated values for FBDIV and PH_ACCUM from register 203 are provided to counter 204. Consequently, counter 204 performs fractional division of $VCO_{OUT}$ by $M_{DES}$ to provide $\theta_{OUT}$.

The following Verilog pseudo code might be employed to implement a phase accumulation fractional divider.

```
100:   input: IREFCLK;        // reference clock
101:   input: MDIV;           // nominal feedback divider value
102:   input: STEP;           // difference between MDIV
                                 and desired MDIV
103:   output: FBDIV;         // integer portion of feedback
                                 divider value
104:   output: PH_ACCUM;      // fractional portion of
                                 feedback divider value
105:
106:
107: always @(negedge IREFCLK or negedge RESETN)
108:   begin
109:     if (RESETN !== 1)
110:       begin
111:         FBDIV = MDIV;
112:         PH_ACCUM = 0;
113:       end
114:     else
115:       begin
116:         {FBDIV,PH_ACCUM} = {MDIV,PH_ACCUM} - STEP; //
117:       end
118: end
```

While the exemplary embodiment of the present invention is described having a fractional divider that employs a phase accumulation technique to perform a fractional division of an input signal, the present invention is not so limited. One skilled in the art may extent the teachings herein to other implementations for fractional dividers.

Jitter performance of PLL 100 is a function of the noise added by the variable feedback value for M and the loop response of the PLL. While PLL 100 is in a locked state, the average output frequency of the PLL is a multiple of the fractional feedback value of the divisor, M.

Figure 3:
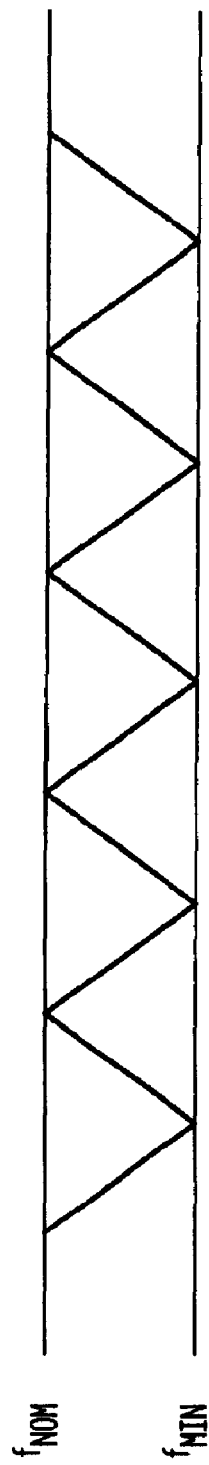
FIG. 3 shows an exemplary triangular spectrum control profile for the PLL of FIG. 1.
Figure 4:
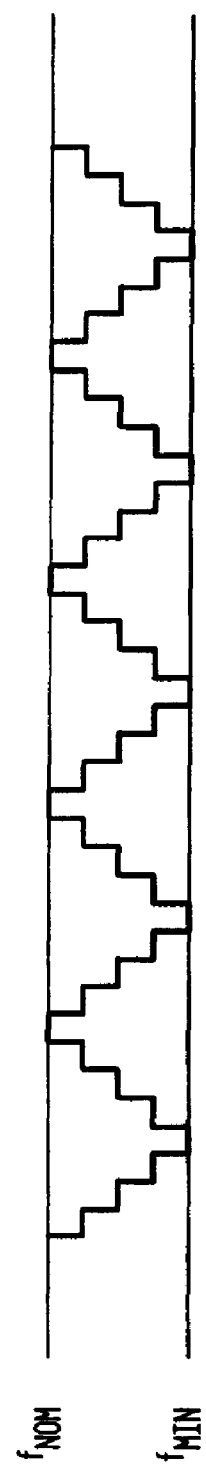
FIG. 4 shows an exemplary quantized triangular spectrum control profile for the PLL of FIG. 1.

FIG. 3 shows an exemplary triangular spreading profile generated by spreading profile controller 106 for the PLL of FIG. 1. The exemplary triangular spreading profile varies the frequency of the VCO output signal from a nominal frequency $f_{NOM}$ down to a minimum frequency $f_{MIN}$. In practice, since the value for M is changed at discrete intervals and because the value for M has a finite-length digital representation, the spreading profile is quantized. FIG. 4 shows an exemplary quantized triangular spectrum control profile for the PLL of FIG. 1. In general, the frequency steps of the quantized triangular spectrum control profile might be smoothed by the loop filter response of the PLL, although additional filtering might be applied.

To create the quantized triangular spreading profile of FIG. 4, an algorithm steps down the value of M from a nominal M value ($M_{MAX}$) by a given amount, termed the step size or slope value, until the minimum value ($M_{MIN}$) for M is reached, and then steps up M by the slope value until the nominal M value $M_{MAX}$ is reached. The process is then repeated. The amplitude of the spreading is set by the minimum value for M, which might be expressed as a fractional M value. For example, for a 30-MHz reference clock signal REF_CLK and an M value of 20, the nominal PLL output frequency might be 600 MHz. If a 0.5% down spread is desired, then the minimum value for M is 20−(20*0.005)=19.9. The minimum value for M, $M_{MIN}$, and the slope value might be pre-computed and stored in a register, or, if the spreading profile were programmable, then $M_{MIN}$ and slope value might be generated in real time based on a set of input parameters. The modulation rate of the spreading profile is the rate at which the frequency is slewed, where the modulation rate is related to the slope value as in equation (1):

$$\text{slope value} = (2 * \text{Modulation Rate/Reference Clock Frequency}) * (M_{MAX} - M_{MIN}) \quad (1)$$

While FIGS. 3 and 4 illustrate down spreading, up spreading might be accomplished by setting the maximum value of M greater than the nominal value for M. In addition, a spreading algorithm might include the features of i) turning spreading "on" and "off" and ii) holding the value of M at a lower (or upper) limit.

Figure 5:
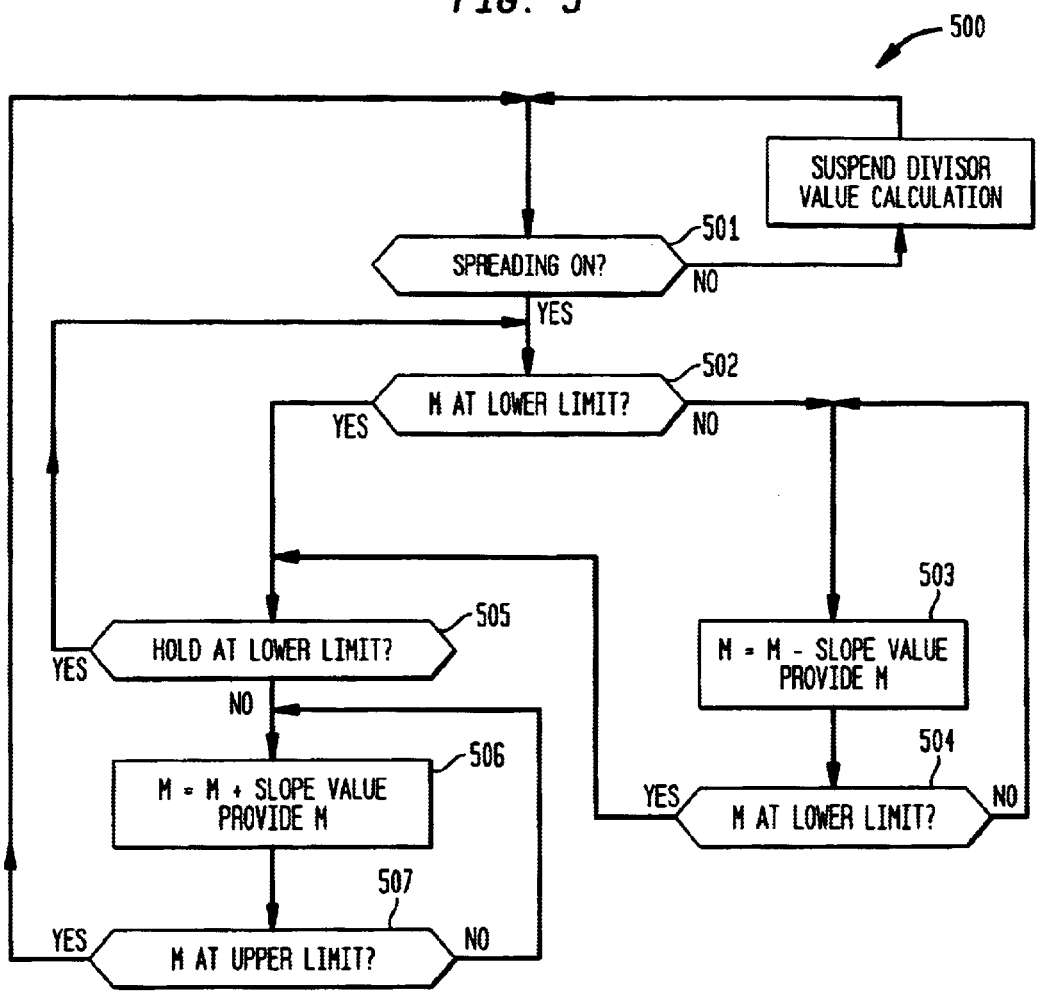
FIG. 5 shows an exemplary method for implementing the quantized triangular spectrum control profile of FIG. 4.

FIG. 5 shows an exemplary method for implementing the quantized triangular spreading profile of FIG. 4. At step 501, an optional test determines whether spreading is enabled, or "ON" and whether the spreading profile controller should generate M values so as to cause the PLL to slew the output frequency in accordance with the spreading profile. If the test of step 501 determines that spreading is not "ON," then the method advances to step 508. At step 508, the method suspends calculating divisor values. From step 508, the method returns to step 501, essentially waiting for spreading to be enabled. If the test of step 501 determines that spreading is "ON," the method advances to step 502.

At step 502, a test determines whether the value for M is at the lower limit for the value. If the test of step 502 determines that M is not at the lower limit, the method advances to step 503. At step 503, the method updates the value for M as (the previous value for M) minus (the slope value). At step 503, the updated value for M is provided, for example, to the fractional (feedback) divider of the PLL. At step 504, a test determines whether the updated value for M is at the lower limit. If the test of step 504 determines M is not at the lower limit, the method returns to step 503.

If either i) the test of step 502 or ii) the test of step 504 determines that M is at the lower limit, the method advances to step 505. At step 505, an optional step holds the value of M at the lower limit value for either i) a predefined period of time (if the frequency is being spread) or ii) an indeterminate period of time (if the center frequency is being shifted to a new value). From step 505, the method advances to step 506. At step 506 the method updates the value for M as (the previous value for M) plus (the slop value). At step 506, the updated value for M is provided, for example, to the fractional divider. At step 507, a test determines whether the updated value for M is at the upper limit. If the test of step 507 determines M is not at the upper limit, the method returns to step 506. If the test of step 507 determines M is at the upper limit, the method returns to step 501.

The following Verilog pseudo code might be employed to implement a triangular spreading profile control state machine.

```
100:    input: IREFCLK;        // reference clock
101:    input: RESETN;         // reset
102:    variable: CONTOUR;     // current value of desired M
103:    variable: SPRD_DIR;    // spreading direction up or down
104:    input: RATE;           // reference clock
105:    input: SSENA;          // spread spectrum enabled
106:    always @ (negedge IREFCLK or negedge RESETN) begin
107:    if (RESETN !==1)
108:       begin              // reset condition
109:          CONTOUR <= 0;
110:          SPRD_DIR <= 0;
111:          RATE <= 0;
112:       end
113:    else
114:       if (SSENA == 0)
115:          begin           // spreading is disabled, go to nominal M
116:             if (CONTOUR == 0)
117:                begin     // hold if CONTOUR is at zero
118:                   CONTOUR <= CONTOUR - 0;
119:                   SPRD_DIR <= 0;
120:                end
121:             else
122:                begin     // return to nominal if COUTOUR != 0
123:                   CONTOUR <= CONTOUR - RATE;
124:                   SPRD_DIR <= 0;
125:                end
126:          end
127:       else
128:          begin           // spreading enabled
129:             if (CONTOUR >= MAX_SPRD)
130:                begin     // hit the max down spread, go up
131:                   CONTOUR <= CONTOUR - RATE;
132:                   SPRD_DIR <= 0;
133:                end
134:             else
135:                if (CONTOUR == 0 && SPRD_DIR == 0)
136:                   begin  // hit nominal
137:                      RATE <= SPRD_RATE;    // get the latest rate
138:                      CONTOUR <= CONTOUR - 0;
139:                      SPRD_DIR <= 1;
140:                   end
141:                else
142:                   if (SPRD_DIR == 1)
143:                      begin   // spreading down
144:                         CONTOUR <= CONTOUR + RATE;
145:                      end
146:                   else
147:                      begin   // spreading up
148:                         CONTOUR < CONTOUR - RATE;
149:                      end
150:                end
151:    end
```

While the exemplary embodiment of the present invention is described using a triangular spreading profile, the present invention is not so limited. One skilled in the art may extent the teachings herein to other spreading profiles, such as sinusoidal or similarly periodic signals, that may be modeled with a linear function. In addition, while the exemplary embodiment is described employing a single spreading profile, one skilled in the art may extend the teachings herein to include two or more spreading profiles. Other embodiments of the present invention may allow for switching between the two or more spreading profiles.

While the exemplary embodiment of the present invention is described for a PLL, the present invention is not so limited. One skilled in the art may extent the teachings herein to other types of signal generators, such as clock generators or timing recovery circuits employing, for example, delay-locked loops (DLLs).

The present invention may allow for the following advantages. A given implementation allows for a programmable spreading profile that may be changed on demand for a given application. In addition, the output frequency of a PLL, or similar reference signal generator/timing recovery circuits, may be varied according to a given spreading profile without need for storing the M values for the feedback divider in memory.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A signal generator circuit comprising:

a spreading profile controller adapted to calculate, in real time, a sequence of divisor values in accordance with a spreading profile characterized by a function; and a fractional divider dividing an output signal of the signal generator circuit by each of the divisor values in the sequence;

wherein the signal generator is adapted to adjust, based on the divided output signal and a reference signal, a frequency of the output signal of the signal generator circuit; and wherein the spreading profile controller calculates each of the divisor values in the sequence so as to vary the frequency of the output signal of the signal generator circuit in accordance with the spreading profile, and wherein the output signal of the signal generator circuit is generated without discontinuities in the varied frequency.

2. The signal generator circuit as recited in claim 1, wherein the spreading profile controller varies the frequency of the output signal so as to switch the frequency from a first value to a second value without an observed discontinuity.

3. The signal generator circuit as recited in claim 2, wherein the spreading profile is a triangular profile.

4. The signal generator circuit as recited in claim 3, wherein the spreading profile controller comprises:

first means for testing whether the spreading profile is up spreading or down spreading;

second means for adding a slope value to a current divisor value to generate a subsequent divisor value if the spreading profile is up spreading; and third means for subtracting the slope value from the current divisor value to generate the subsequent divisor value if the spreading profile is down spreading.

5. The signal generator circuit as recited in claim 1, wherein the spreading profile controller receives a signal indicating whether spreading is enabled and, if spreading is not enabled, suspends calculating divisor values.

6. The signal generator circuit as recited in claim 1, wherein the fractional divider is phase accumulation fractional divider.

7. The signal generator circuit as recited in claim 6, wherein the phase accumulation fractional divider comprises:

an accumulator storing a current divisor value in the sequence as an integer component and as a fractional component; and a counter adapted to divide the output signal by the integer component, wherein the counter selects, as the divided output signal, a phase of the counter based on the fractional component.

8. The signal generator circuit as recited in claim 7, wherein the phase accumulation fractional divider comprises a combiner adapted to update the integer component and the fractional component based on a subsequent divisor value.

9. The signal generator circuit as recited in claim 1, wherein the spreading profile is one of a plurality of spreading profiles, and the spreading profile controller is adapted to select one of the plurality of spreading profiles.

10. The signal generator circuit as recited in claim 1, wherein the signal generator is either a phase-locked loop (PLL) or a delay-locked loop (DLL).

11. A method of implementing a signal generator comprising the steps of:

(a) calculating a divisor value in real time in accordance with a spreading profile characterized by a function;

(b) dividing an output signal of the signal generator by the divisor value;

(c) adjusting, based on the divided output signal and a reference signal, a frequency of the output signal of the signal generator;

(d) calculating a new divisor value in accordance with a spreading profile; and (e) repeating steps (a) through (d) so as to vary the frequency of the output signal of the signal generator in accordance with the spreading profile without discontinuities in the slewed frequency.

12. The method as recited in claim 11, wherein step (e) further comprises the step of:

varying the frequency of the output signal so as to switch the frequency from a first value to a second value without an observed discontinuity.

13. The method as recited in claim 11, wherein the spreading profile is a triangular profile.

14. The method as recited in claim 13, wherein step (d) calculates the new divisor value by the steps of:

(d1) testing whether the spreading profile is up spreading or down spreading; if the spreading profile is up spreading, then (d2) adding a slope value to the divisor to generate the new divisor; and if the spreading profile is down spreading, then (d3) subtracting the slope value from the divisor to generate the new divisor.

15. The method as recited in claim 11, further comprising the step of testing whether spreading is enabled and, if spreading is enabled, performing steps (a) through (e) and, if spreading is not enabled, suspending steps (a) through (e).

16. The method as recited in claim 11, wherein, for step (b), the dividing step includes the step of implementing a fractional accumulation method.

17. The method as recited in claim 16, wherein the fractional accumulation method step comprises the steps of:

(b1) separating the divisor value into an integer component and a fractional component;

(b2) dividing, with a counter, the output signal by the integer component; and (b3) selecting, as the divided output signal, a phase of the counter based on the fractional component.

18. The method as recited in claim 17, wherein, for step (d), the integer component and the fractional component are updated based on the new divisor value.

19. The method as recited in claim 11, wherein, for step (a), the spreading profile is one of a plurality of spreading profiles, and step (a) further comprises the step of selecting one of the plurality of spreading profiles.

20. The method as recited in claim 11, wherein the method implements a signal generator as either a phase-locked loop (PLL) or a delay-locked loop (DLL).

* * * * *